(12) United States Patent
French et al.

(10) Patent No.: US 8,895,951 B2
(45) Date of Patent: Nov. 25, 2014

(54) CLOSED LOOP SPUTTERING CONTROLLED TO ENHANCE ELECTRICAL CHARACTERISTICS IN DEPOSITED LAYER

(75) Inventors: Wayne R French, San Jose, CA (US);
Tony P. Chiang, Campbell, CA (US);
Pragati Kumar, Santa Clara, CA (US);
Prashant B Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 180 days.

(21) Appl. No.: 13/249,631

(22) Filed: Sep. 30, 2011

(65) Prior Publication Data

US 2012/0256155 A1 Oct. 11, 2012

Related U.S. Application Data

(62) Division of application No. 12/243,322, filed on Oct. 1, 2008, now Pat. No. 8,053,364.

(51) Int. Cl.

| H01L 47/00 | (2006.01) |
|---|---|
| C23C 14/08 | (2006.01) |
| C23C 14/00 | (2006.01) |
| C23C 14/54 | (2006.01) |
| H01L 45/00 | (2006.01) |
| H01L 27/24 | (2006.01) |

(52) U.S. Cl.
CPC ............ *C23C 14/083* (2013.01); *C23C 14/0042* (2013.01); *C23C 14/54* (2013.01); *H01L 45/08* (2013.01); *H01L 45/1233* (2013.01); *H01L 45/146* (2013.01); *H01L 45/1625* (2013.01); *H01L 45/1641* (2013.01); *H01L 45/165* (2013.01); *H01L 27/2409* (2013.01); *H01L 27/2463* (2013.01)
USPC ............................ 257/4; 257/E45.003; 438/3

(58) Field of Classification Search
USPC .................................................. 257/E45.003
See application file for complete search history.

(56) References Cited

U.S. PATENT DOCUMENTS

| 5,810,923 | A | * | 9/1998 | Yano et al. ...................... 117/84 |
|---|---|---|---|---|
| 2002/0076837 | A1 | * | 6/2002 | Hujanen et al. .................... 438/3 |
| 2003/0222322 | A1 | * | 12/2003 | Park et al. ...................... 257/421 |
| 2003/0235961 | A1 | * | 12/2003 | Metzner et al. ................ 438/287 |
| 2004/0062117 | A1 | * | 4/2004 | Perner et al. ................... 365/209 |
| 2004/0174740 | A1 | * | 9/2004 | Lee et al. ........................ 365/171 |
| 2005/0247921 | A1 | * | 11/2005 | Lee et al. ........................... 257/2 |
| 2006/0062044 | A1 | * | 3/2006 | Jeong et al. .................... 365/158 |
| 2007/0018219 | A1 | * | 1/2007 | Lim et al. ...................... 257/296 |
| 2007/0227877 | A1 | * | 10/2007 | Wang .......................... 204/192.1 |
| 2007/0269683 | A1 | * | 11/2007 | Chen et al. .................... 428/697 |
| 2008/0242719 | A1 | * | 10/2008 | Muller et al. .................. 514/417 |
| 2008/0247219 | A1 | * | 10/2008 | Choi et al. ..................... 365/148 |
| 2008/0272363 | A1 | * | 11/2008 | Mouli .............................. 257/14 |
| 2009/0026434 | A1 | * | 1/2009 | Malhotra et al. .................. 257/2 |
| 2009/0052225 | A1 | * | 2/2009 | Morimoto ..................... 365/148 |

* cited by examiner

*Primary Examiner* — Wensing Kuo
*Assistant Examiner* — Shaka White

(57) ABSTRACT

This disclosure provides a method of fabricating a semiconductor device layer and an associated memory cell. Empirical data may be used to generate a hysteresis curve associated with deposition for a metal-insulator-metal structure, with curve measurements reflecting variance of an electrical property as a function of cathode voltage used during a sputtering process. By generating at least one voltage level to be used during the sputtering process, where the voltage reflects a suitable value for the electrical property from among the values obtainable in mixed-mode deposition, a semiconductor device layer may be produced with improved characteristics and durability. A multistable memory cell or array of such cells manufactured according to this process can, for a set of given materials, be fabricated to have minimal leakage or "off" current characteristics ($I_{leak}$ or $I_{off}$, respectively) or a maximum ratio of "on" current to "off" current ($I_{on}/I_{off}$).

19 Claims, 8 Drawing Sheets

Partial Pressure (Reactive Element, e.g. $O_2$, $O_3$ or something else)

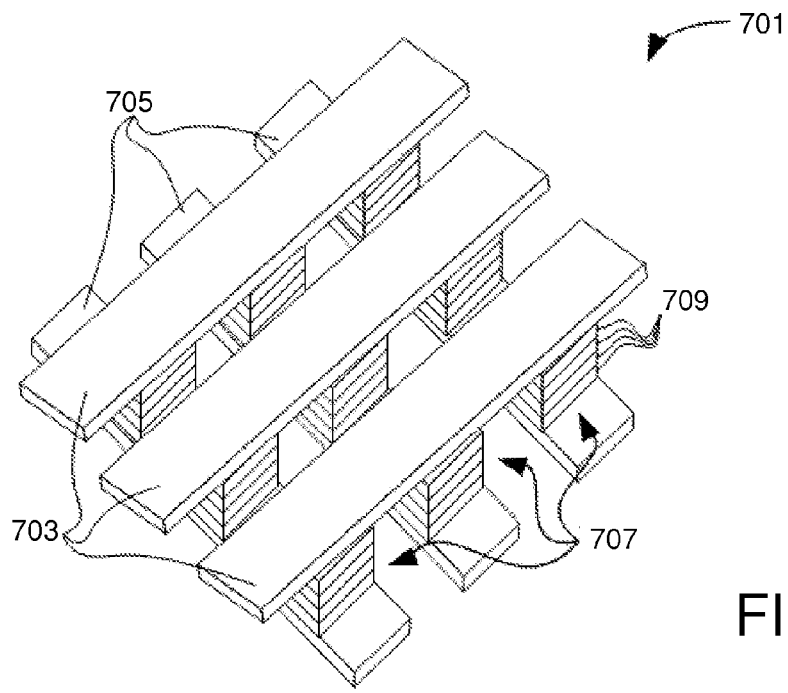
FIG. 7
FIG. 8
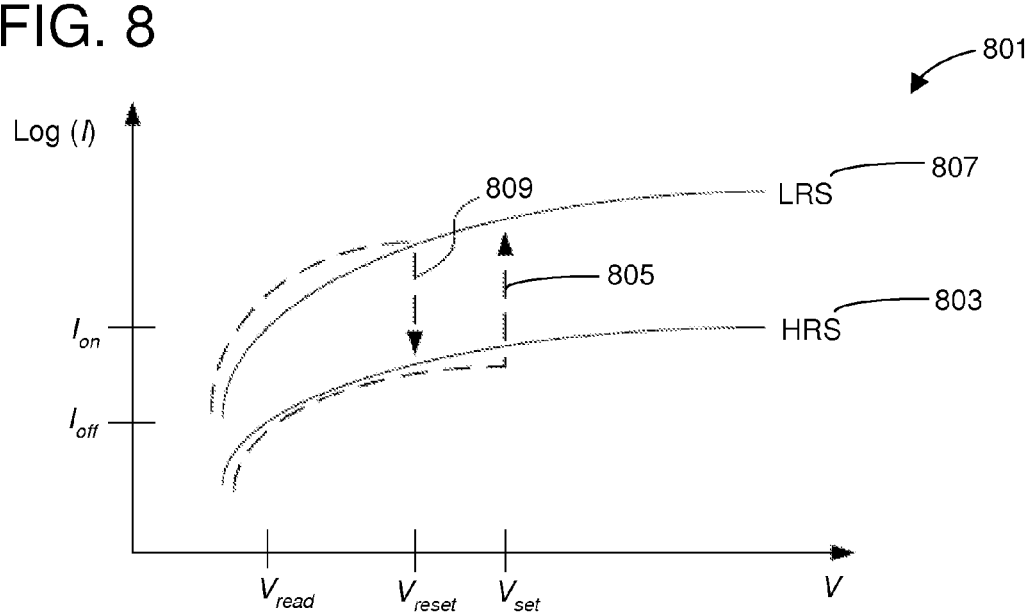

CLOSED LOOP SPUTTERING CONTROLLED TO ENHANCE ELECTRICAL CHARACTERISTICS IN DEPOSITED LAYER

This application is a divisional application of U.S. patent application Ser. No. 12/243,322, filed Oct. 1, 2008. This document claims the benefit of U.S. Provisional Application No. 61/049,752, for Non-Volatile Resistive-Switching Memories, filed by inventors Prashant B. Phatak, Tony Chiang, Pragati Kumar and Michael Miller on May 1, 2008, which is hereby incorporated by reference. This document also claims the benefit of U.S. Provisional Application No. 61/052,168, for Non-Volatile Resistive-Switching Memories, filed by inventors Wayne French, Pragati Kumar, Prashant Phatak and Tony Chiang on May 10, 2008, which is hereby incorporated by reference.

BACKGROUND

Generally speaking, it is desired to be able to fabricate semiconductor device layers having improved operational and durability characteristics. Such characteristics may be closely tied to device current flow characteristics. In the case of memories that store charge, for example, dynamic random access memory ("DRAM") and flash memory, charge leakage over time can render cell contents unreliable. With other forms of memory, including multi-state (i.e., "multistable") forms such as resistive RAM ("ReRAM"), magnetic RAM ("MRAM"), phase change and other similar technologies, it is generally desired to have low power devices where logic state can be detected by sensing current flow, where there is large separation between magnitude of current flow associated with each state.

A need exists for methods for creating semiconductor devices having improved electrical characteristics, particularly in terms of leakage current, "off" current or ratio between current draws associated with sensing the various states of multistable materials. The present invention addresses these needs, and provides further, related advantages.

BRIEF DESCRIPTION OF THE DRAWINGS

FIG. 3 shows a plot of "off" current of a finished semiconductor device having an $Al_2O_3$ layer as a function of variation of cathode voltage used during the deposition process ("off" current is labeled "$I_{off}$" in FIG. 3). FIG. 3 is also labeled to indicate deposition rates associated with the sputtering process; as concentration of the reactive gas increases, the target becomes increasingly "poisoned," which slows deposition rates.

FIG. 4 uses the same horizontal axis as FIG. 3 (concentration of reactive gas, in this case, oxygen), but relies on a left-hand vertical axis to identify deposition rates and a right-hand vertical axis to identify "off" current ($I_{off}$), each shown by separate curves in FIG. 4. What FIG. 4 helps indicate is that (a) the relative combinations of metal and metal oxide in the deposited layer, and their associated bonding and defect characteristics, result in a minimum $I_{off}$ for the specific deposition process and materials at a specific point 415 in the hysteresis curve, with intermediate ranges 413 and 411 also producing generally acceptable results, and (b) particular points within these ranges may be preferred, depending on desired or allowable deposition rates.

FIG. 7 is a three-dimensional view depicting components of an array 701 of multistable memory cells. Each cell if desired may be fabricated according to the principles described herein.

FIG. 8 presents a graph 801 that plots current versus voltage characteristics of a multistable memory device; in particular, FIG. 8 shows curves 803 and 807 associated with a bistable memory device, showing each of a high resistance state and low resistance state, respectively.

FIG. 9 is used to compare an Ohmic response 903 with a non-linear response 907 (the latter being desired for operation of a multistable memory device).

DETAILED DESCRIPTION

Figure 1:
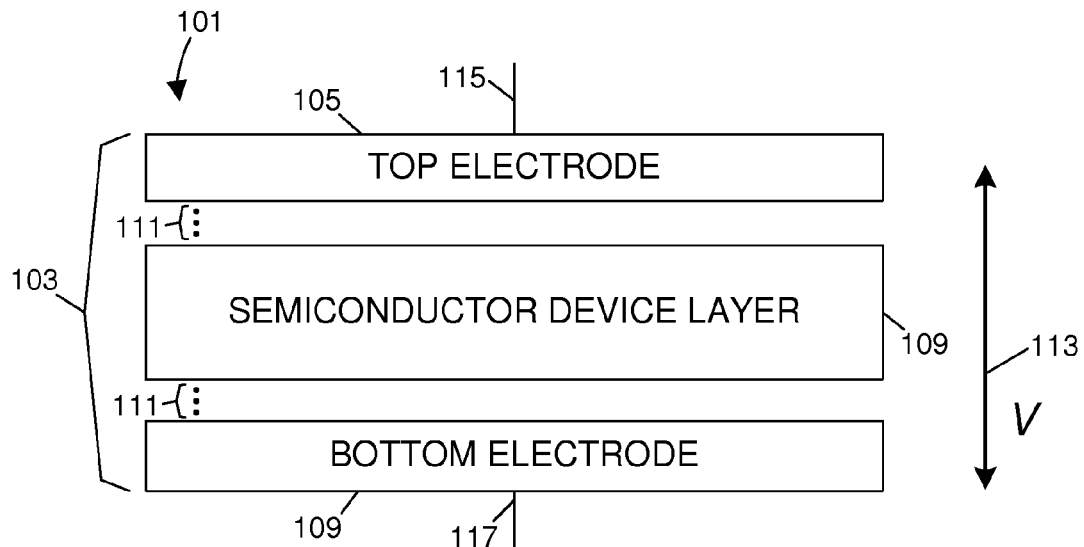
FIG. 1 is a cross-sectional diagram showing a metal-insulator-metal ("MIM") stack.

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of depositing a semiconductor device layer, namely, one that uses a closed-loop sputtering process where voltage is controlled in view of desired electrical properties and (ii) a device based on such a method, implemented for example as a capacitor, a ReRAM cell, DRAM cell, flash cell or other structure. The invention, however, may also be applied to other methods and devices as well.

I. Overview.

As exemplified by the embodiments discussed below, this disclosure provides methods for fabricating semiconductor materials and devices using a closed-loop sputtering process, with specific control over target voltage (i.e., cathode voltage in a typical sputtering arrangement) and concentration of a reactive gas. The specific control used is tailored to produce materials and devices having the appropriate electrical characteristics. It is believed that this control achieves this result by fostering amorphous semiconductor materials having appropriate combinations of metals with metal oxides, with complex bonding characteristics that do not substantially consist only of oxides in crystalline form.

It is particularly desired to create devices having minimal leakage current (e.g., for DRAM devices), "off" current ($I_{off}$), maximum ratio between current flows associated with multi-stable structures, or a combination of two or more of these properties. Depending on device, it might be desired to optimize one particular current characteristic at the expense of another. For example, in a bistable resistive random access memory device ("ReRAM" or "RRAM"), one might wish to maximize a ratio of $I_{on}/I_{off}$ (i.e., the ratio of low resistance state current flow to high resistance state current flow) without regard to leakage current, and in some embodiments, it may even be desired to maximize leakage current (e.g., in certain ReRAM embodiments where high leakage current may reflect the presence of defects that facilitate different device states). The particular one of these statistics that is most pertinent to a designer will depend upon memory structure and implementation with $I_{off}$ and the ratio of $I_{on}/I_{off}$ being generally more important to RRAM and other multistable designs. As will be described further below, the reasons for these improved characteristics might be that these structural characteristics assist the formation of traps and defects in the semiconductor device layer (e.g., the metal oxide layer).

The memory devices most pertinent to the teachings provided herein will typically feature some configuration of a metal-insulator-metal ("MIM") structure, with the insulator being formed of one or more semiconductor material layers. The semiconductor device layer is typically based on a metal-oxide mixture, sometimes involving oxides of several metals, but nearly any material suitable to or conventional in semiconductor manufacture may be used including, without limitations, other types of oxides, metal nitrides, perovskites, chalcogenides, or other materials.

Without being bound by theory, it is believed that such improved devices and device characteristics may be obtained through amorphous metal oxide layers having a combination of metals and metal oxides, and complex bonding characteristics between these elements; that is to say, it is believed that semiconductor device layers featuring complex bonding between its constituent elements (e.g., one or more metals and oxygen) provide devices having better electrical characteristics, namely, better minimal leakage current, "off" current ($I_{off}$), or a maximum ratio between "on" and "off" currents (for multistable structures). For example, in applications where it is desired to minimize leakage current, it is believed that by using the techniques described herein, one may fabricate devices having a leakage current density of less than 40 A/cm2 in an "off" state 0.5V per 20 nanometers of thickness of semiconductor device layer. The "off" current is generally related to the leakage of the material and the size of the device, and generally, the leakage should be low enough that the "off" current remains low and provides adequate separation between "on" and "off" currents (i.e., such separation promotes discrete, easily distinguished "on" and "off" states for a multistable device).

In the description that follows, FIGS. 1-6 will be used to provide an overview to materials and structures that may be fabricated using the teachings provided using these principles, and associated fabrication processes; FIGS. 7-13 will be used to provide additional details regarding a specific RRAM structure; and FIGS. 14-16 will be used to provide additional details regarding a closed-loop sputtering system that may be used for fabrication.

FIG. 1 shows a device 101, having a MIM stack 103 that includes a top electrode 105, a bottom electrode 107, and a semiconductor device layer 109 sandwiched between the electrodes. As indicated by groups of separation dots 111, there may be additional layers between either electrode and the semiconductor device layer 109 (certain embodiments discussed further below will discuss defect access layers and other types of layers that may be used for specific purposes). It should also be appreciated that the semiconductor device layer 109 may also consist of a single layer, or a number of individual constituent layers. Irrespective of the number of layers, or whether additional layers (not seen) are included, the structure is such that a semiconductor (insulator) layer is operatively positioned between the two electrodes (as reflected by the "MIM" acronym).

To operate the device 101 as a memory cell, a voltage drop is placed across the stack, as indicated in FIG. 1 by an arrow 113; the voltage drop may be of either polarity. In embodiments where information is stored as a charge (e.g., DRAM and flash), the top electrode 105 may be used to hold a charge with respect to the bottom electrode 107; alternatively, with other types of devices, e.g., those having one or more materials that change physical state, such as a RRAM device, a voltage drop may be placed across the electrodes only when it is desired to read or program the cell (e.g., to cause a current to flow across the stack), and the voltage can be different, or made to have opposite polarity, for each of these functions, depending on materials used and end-device characteristics. A lead line 115 is illustrated in FIG. 1 as coupled to the top electrode for purposes of supplying a first potential, and a second lead line 117 is illustrated as coupled to the bottom electrode 109 for purposes of applying a second potential.

Figure 2:
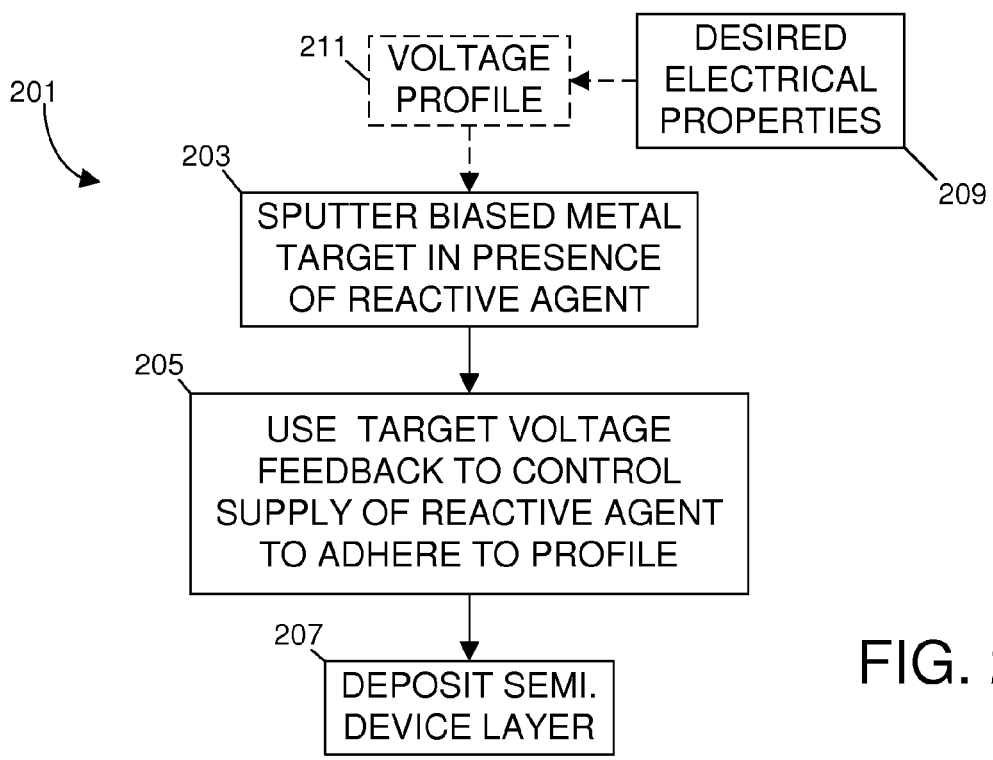
FIG. 2 is a flow chart that illustrates a method 201 of depositing a semiconductor device layer; if desired, the method 201 may also optionally be used to deposit others of the layers seen in FIG. 1.

As indicated above, it is generally desired to fabricate materials and devices having improved operational and durability characteristics. To this end, FIG. 2 presents a flow diagram 201 used to illustrate a physical vapor deposition ("PVD") method by which such materials and devices may be fabricated. The method of FIG. 2 may be used to produce the devices described in connection with FIG. 1 or 6-13 (see description below), but is by no means the only way that such memory cell devices can be fabricated.

As seen in FIG. 2, the method calls for sputtering a biased metal target in the presence of a reactive element (e.g., a reactive gas). A typical sputtering environment for this purpose will typically feature a source of ions (e.g., a plasma) that are motivated to strike a target, and to erode material from the target in a manner adapted for a reactive process, with a gas introduced into the deposition chamber. The actual reaction with the gas may occur either during transfer of eroded material onto the substrate, or after the material has settled on the substrate but, in either case, the sputtering procedure results in a semiconductor device layer being deposited on the substrate. Block 203, depicted in FIG. 2, represents these various processes.

As indicated by a second block 205, the specific method of FIG. 2 calls for using target voltage feedback to control the supply of the reactive element. In this regard, in the specific PVD process called for by FIG. 2, the presence of too much gas may effectively cause the reaction to proceed too quickly, and may actually reduce cathode voltage as seen by the ions (due to reduction in free electrons)—this may both change the quality of the deposited layer as well as deposition rates. Too little reactive agent may also affect quality of the deposited layer, by causing too much "pure" metal to be deposited—this may cause fabrication of a layer with current flows that are too high (with the metal effectively acting to short the device). The completed deposition of the semiconductor device layer is denoted by a third block, labeled 207 in FIG. 2.

In order to create a suitable semiconductor device layer, the target voltage is controlled (e.g., by controlling the mixture of reactive gas) in view of desired electrical properties, as indicated by block 209 of FIG. 2. For example, these properties may be a desired leakage current, $I_{off}$ or $I_{on}/I_{off}$ characteristic, as alluded to in the text above. Through a pre-manufacture process, a number of devices can be created, each using different target voltages and reactive agent concentrations, to empirically determine how these factors influence electrical properties of the end-device. Determination of a suitable voltage or a suitable series of voltages by this method (e.g., one or more individual voltages used at different times during deposition or throughout the entire deposition) may be used to create a voltage profile, as depicted by a dashed line function box 211 in FIG. 2. Thus, the method of FIG. 2 calls for voltage to be specifically controlled during the deposition process, so as to manufacture materials and devices having specifically desired electrical properties, with the voltage selected based on those properties. For example, as will be presented in an embodiment discussed below, a deposition procedure may begin using a target voltage that produces results well outside of "poison mode" (i.e., in "mixed-mode") for the deposition process, and may then be increased to cause the process to move closer to (but still occur outside) of the poison mode for the particular deposition process. Other materials and processes used may call for a different voltage profile; for example, a hysteresis curve associated with the particular process and materials may call for an initial target voltage "in" poison mode and for change of that voltage away from poison mode.

Figure 3:
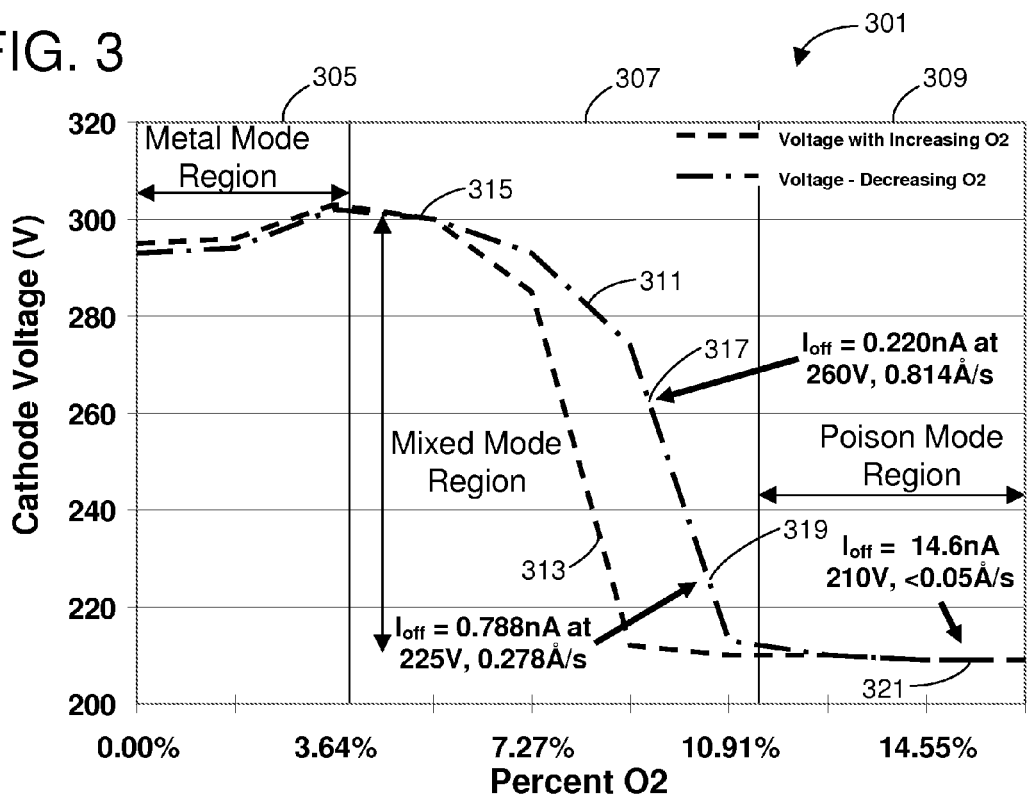
FIG. 3 is a hysteresis diagram showing electrical properties of a semiconductor device layer ($Al_2O_3$) deposited via a reactive sputtering process, as a function of cathode voltage used in the sputtering process. In particular.

FIG. 3 provides a graph 301 of a hysteresis curve for one exemplary deposition process, namely, one that involves the formation of a one-hundred Angstrom thick aluminum oxide ($Al_2O_3$) layer on a substrate. As indicated by FIG. 3, the deposition may be characterized by a curve, relative to varying cathode voltage and reactive gas concentration (i.e., "$O_2$" concentration in a partial vacuum in the case of FIG. 3). The graph may be divided into three regions, including a metal mode region 305, a mixed-mode region 307, and a poison mode region 309. The reaction and its influence on cathode voltage varies in dependence upon whether the oxygen concentration is increasing toward poison mode, or decreasing from poison mode, as represented by two different graph line patterns, 311 and 313. In the metal mode region, the reactive gas concentration is too low, and the deposition will essentially transfer pure metal to the substrate, thus the term "metal mode." In the mixed-mode region 307, both metal and reacted metal oxide is transferred to the substrate as part of the deposited layer, thus the term "mixed-mode." In some embodiments described herein, mixed-mode deposition is desired to deposit a layer having proper stoichiometry and a reasonable deposition rate. As the concentration of the reactive agent is increased, it eventually overwhelms the target, poisoning the target such that it reduces cathode voltage and such that the deposition rate slows—the region represented by this "poisoning," not surprisingly, is termed the "poison mode" region.

FIG. 3 bears labels associated with three specific data points, 317, 319 and 321. The first data point 317, mid-way along the sloped portion of the hysteresis curve has been found to result in a semiconductor device layer that, at a normalized thickness, has an $I_{off}$ characteristic of 0.220 nano-Amps ("nA"); point 317 also indicates that the cathode voltage at this point is 260 volts, and that the deposition rate at this point is approximately 0.814 Angstroms per second ("Å/s"). The values associated with the second point and third points 317 and 319, respectively, are 0.788 nA, 225 volts, 0.278 Å/s, and 14.6 nA, 210 V and less than 0.05 Å/s. Recalling that in metal mode, the $I_{off}$ will asymptotically increase (as pure metal provides a shorting characteristic and thus a large current, e.g., at a top of the hysteresis curve, at point 315), what FIG. 3 indicates is that at varying cathode voltages even within the mixed-mode region, the deposition process can produce materials and devices with widely varying electrical characteristics. With careful control over the process, semiconductor device layers and associated devices can be produced that have desired electrical characteristics. For example, in the curve of FIG. 3, the first point 317 provides for better layer and device characteristics than the other three points (315, 319 and 321), because $I_{off}$ at this point is minimized, and deposition rate is relatively high.

Figure 4:
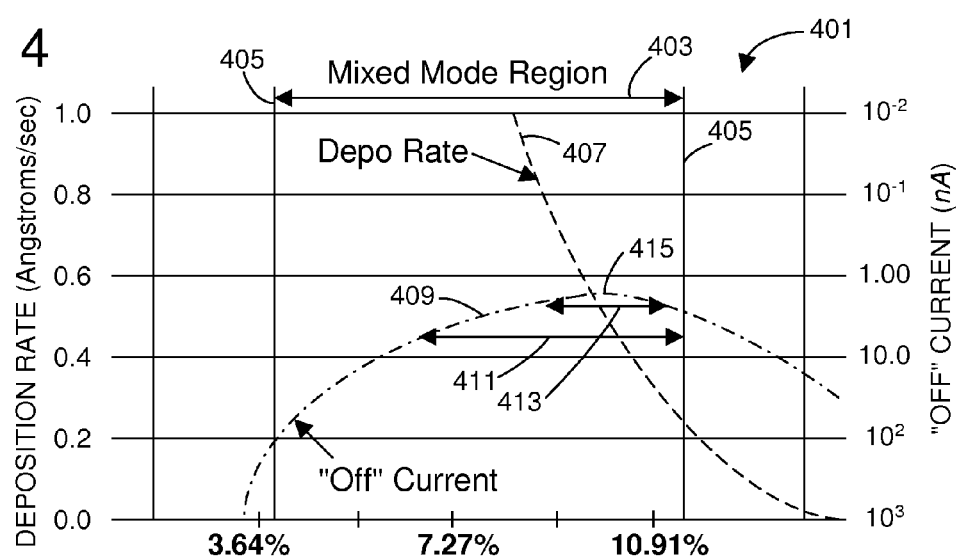
FIG. 4 is a combination graph that corresponds to FIG. 3.

FIG. 4 provides another graph 401 used to illustrate how the deposition process may be controlled through appropriate selection of predetermined cathode voltage. In particular, a left-hand vertical axis of the graph 401 provides a legend for deposition rate, measured in Angstroms per second (Å/s), while a right-hand vertical axis provides a legend for "off" current ($I_{off}$) (the bottom of the vertical axis represents large current, and it is desired to fabricate layers at points relatively "higher" on the graph). A mixed-mode region 403 is depicted in the center of FIG. 4, separated by a pair of vertical lines 405 that demark the metal mode and poison mode regions, respectively. In this regard, a first curve 407 charts deposition rate in the reaction as a function of reactive agent concentration; as indicated by FIG. 4, for lower concentrations of the agent (i.e., further away from poison mode), deposition rate is higher. A second curve 409 charts $I_{off}$ as a function of reactive agent concentration; this curve is seen to be a parabolic curve, having a first region 411 where reasonably acceptable $I_{off}$ characteristics are obtained, a second region 413 where even better $I_{off}$ characteristics are obtained, and a point 415 where $I_{off}$ is minimum.

As depicted by FIG. 4, higher deposition rates provide for lower manufacturing costs, but potentially at the expense of device quality in regions where higher deposition rates result in suboptimal electrical characteristics of the finished device; thus, production of materials and devices having improved electrical characteristics counsels for reconciling deposition rates with desired electrical characteristics. Producing devices with reasonably acceptable electrical characteristics (within a range of tolerance) provides greater tolerance for different deposition rates, whereas producing devices with minimum "off" current or leakage current (for example) may, for some materials, involve suboptimal deposition times.

Figure 5:
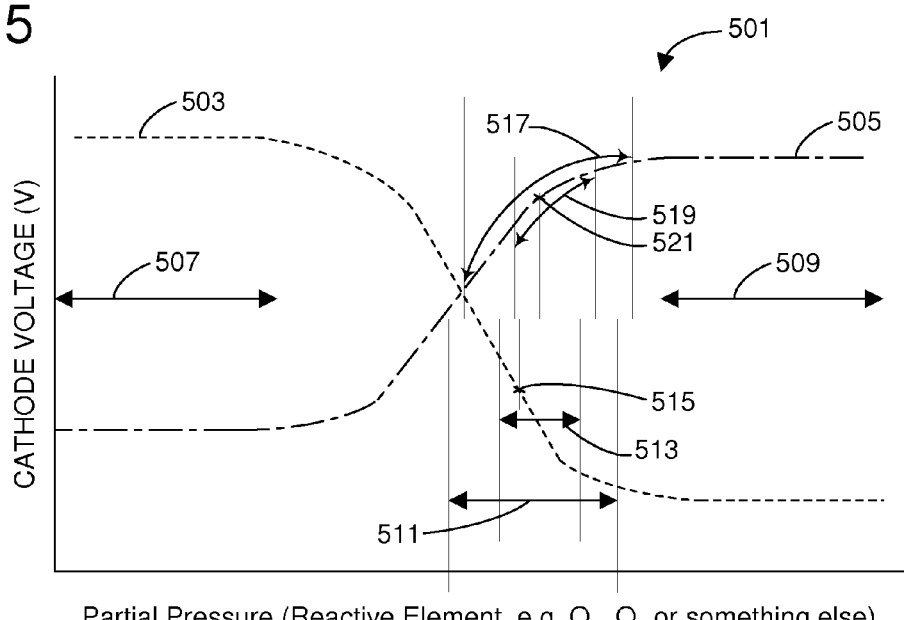
FIG. 5 is a graph similar to FIG. 4, but which superimposes a point of minimum $I_{off}$ as well as ranges of $I_{off}$ for each of two different hysteresis curves 503 and 505. While many materials will have a downward sloping hysteresis curve such as represented by curve 503, there are also materials that exhibit an inverted hysteresis curve (e.g., per curve 505). The graph presented in FIG. 5 is illustrative only, i.e., typically the voltage ranges as well as reactive gas concentrations associated with hysteresis curves for two different materials would also be different.

FIG. 5 depicts a graph 501 that illustrates two different, superimposed hysteresis curves, respectively labeled 503 and 505. Notably, the second hysteresis curve 505 features an increasing slope (i.e., the opposite of the negative slope seen in FIG. 3); the increasing slope indicates that cathode voltage for certain combinations of materials may actually increase (instead of decrease) for greater reactive gas concentrations, as oxides of certain materials may actually increase secondary electron production (relative to metal mode). As with the previous example, discussed above in connection with FIG. 4, the graph 501 identifies a metal mode region 507 and a poison mode region 509, with a mixed-mode region 511 there between, in which it is desired to perform deposition. In accordance with the teachings provided above, each hysteresis curve may be plotted in advance, via empirical determinations, and analyzed to determine how desired deposition influences desired electrical properties. For example, for the first curve 503, i.e., the one with the negative slope common to the examples described earlier, different regions of tolerance may be established for desired electrical properties, as exemplified by hypothetical ranges 511 and 513 and point 515. With these ranges determined, a closed-loop sputtering process may employed, with concentration of the reactive gas used to modulate cathode voltage to urge the deposition to a specifically desired voltage (or voltages). As mentioned, the voltage profile may consist of a constant, single voltage used throughout the deposition process, or it may include one or more transitions between different voltage points during a continuous deposition process. As will further be identified below, in connection with the discussion of a co-sputtering process, multiple materials may be simultaneously deposited in this manner, each using different voltages as appropriate. Similarly, for the second curve 505, i.e., the curve having the positive slope, different hypothetical regions of tolerance can also be established, as represented by numerals 517 and 519 and point 521. For example, numeral 517 and the associated portion of the curve it designates, as represented by a curved arrow in FIG. 5, refer to a range of tolerance around a desired electrical property where adherence to the desired voltage need only be "good" and thus that can potentially accommodate higher depositions rates. Notably, inverting polarity of the slope implies inversion in the dependence of reactive gas pressure upon cathode voltage, i.e., when using different materials, it generally is desired to (a) compute a hysteresis curve appropriate to the machine being used and the deposition materials and (b) adjust control parameters, so that voltage deviation applies an impetus having the strength and polarity needed to properly control reactive gas pressure.

Figure 6:
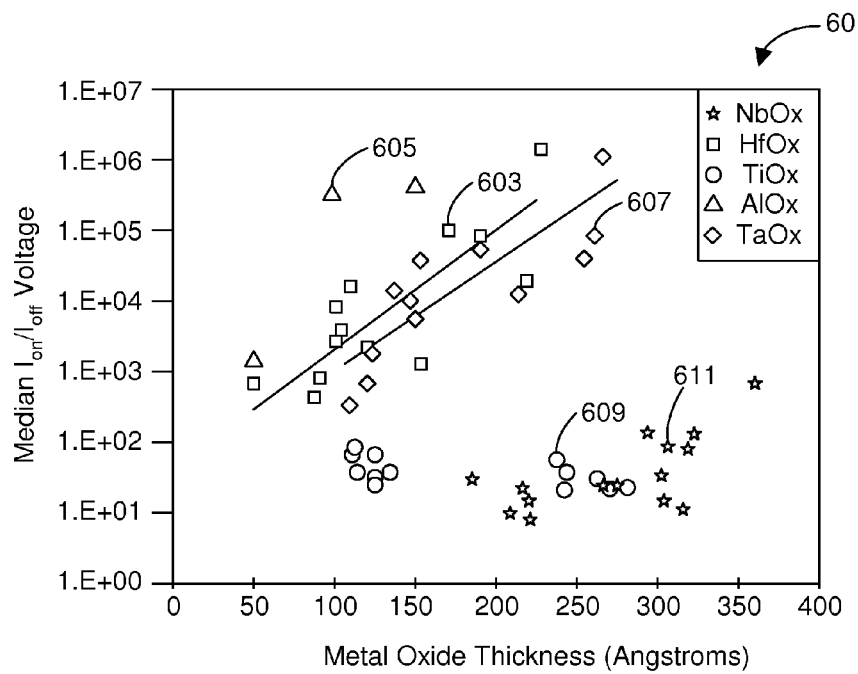
FIG. 6 is a graph showing the relationship between thickness of a metal oxide layer and ratios of "on" current to "off" current ("$I_{on}/I_{off}$") for several materials used in memory cells described herein. The nomenclature "on" current is used herein to refer to a current flow associated with a state other than the base state (e.g., with the base state being the highest resistance state, in which current flow is lowest) rather than strictly requiring that only two states be present.

It will be recalled that the data presented in FIG. 4 represents deposition of a one-hundred Angstrom thick semiconductor device layer, consisting substantially of aluminum oxide. Other thicknesses of the semiconductor device layer are also possible, and many other materials may also be used in lieu of aluminum oxide to achieve good results, including for example titanium oxide. While by no means exhaustive as to these materials, FIG. 6 presents a graph 601 that identifies the ratio of "on" current to "off" current ($I_{on}/I_{off}$) for a number of materials, including oxides of niobium, hafnium, titanium, aluminum and tantalum. As will be discussed further below, in some embodiments, hafnium, aluminum and tantalum in particular are of special interest, because they each represent higher bandgap materials, that is, where the bandgap is at least four electron volts (eV). Generally speaking, it may desired not only to minimize "off" current in a multistable memory device, but also to maximize the difference between current flows associated with each state of the device which correlates with a high ratio between the resistances of "on" and "off" states. The graph in FIG. 6 indicates that the obtainable ratio is a function of each of semiconductor device layer thickness and material type, with higher ratios being obtained for higher bandgap materials. Thus, a first set of data 603 indicates that hafnium oxide (bandgap of 5.7 eV) provides a fairly high ratio, almost as high as the ratio 605 associated with aluminum oxide (bandgap of 8.4 eV). Data 607 indicates that tantalum oxide (bandgap of 4.6 eV) also provides a relatively high $I_{on}/I_{off}$ ratio, substantially better than the ratio associated with data 609 and 611 for titanium oxide and niobium oxide, respectively (both having bandgaps of less than 4.0 eV, 3.0 and 3.4 eV, respectively). Thus, it may be preferred in some embodiments to fabricate a semiconductor device layer from materials having a bandgap of at least 4.0 eV, to enhance discrimination between current flows associated with each state of a multistable device. Zirconium oxide and yttrium oxide are also high bandgap materials that it is believed may be also employed to this end. Notably, these materials and processes are exemplary only, and may not be desired for all implementations; for example, while promoting generally high $I_{on}/I_{off}$ ratios, high bandgap materials may not be the most appropriate materials where other electrical characteristics are to be emphasized.

With an overview of materials and devices, fabrication processes and methods that may be used to enhance device operational characteristics thus presented, specific devices will now be discussed in greater detail. The embodiments presented below identify specific materials that may form the basis for devices of one or more memory cells, or arrays of such cells. The fabrication methods discussed herein may be applied to other devices, and the devices discussed below may also be fabricated by other processes. Still more particularly, the discussion that follows will focus on the fabrication of RRAM cells having two stable states, including a high resistance state (that consequently has a relatively low "off" current associated with it), and a low resistance state (that consequently has a relatively high "on" current associated with it).

II. An Exemplary MIM Structure.

One type of device that may be fabricated is a memory device having an array of resistive random access memory cells (i.e., "ReRAM" or "RRAM" cells). FIG. 7 illustrates a memory array 701 having a number of such cells 703. The array itself may be part of an integrated circuit or another type of memory device (not seen in FIG. 7). Read and write circuitry (also not seen in FIG. 7) may be connected to individual signal lines 705 and 707; these signal lines are also sometimes called "word" lines and "bit" lines or "row" lines and "column" lines. These signal lines 705 and 707 are used to read data from and write data into the various cells 703 in the array. As mentioned above and as will be described further below, each cell 703 may be formed from one or more layers (such as exemplified by numeral 709); one or more of these may be semiconductor device layers, fabricated in particular to include metal oxides according to the processes introduced above. The arrays depicted in FIG. 7 can be further stacked in a vertical fashion to make three-dimensional memory arrays.

Each cell 703 seen in FIG. 7 typically is configured as a MIM stack that includes one or more metal oxide semiconductor device layers between two metal electrodes, where the device is multistable (i.e., exhibits several stable states each having different impedance). Energy typically is not required to maintain these states, such that these states may be used to store digital data for use in electronics applications in the absence of power. Any suitable read and write circuitry and array layout scheme may be used to connect the memory cells so as to form a memory device constructed from multistable cells. For example, a unique combination of horizontal and vertical signal lines (e.g., row and column lines) 705 and 707 may be connected directly to the terminals of each cell. The scheme introduced here and depicted in FIG. 7 is merely illustrative.

A. Device Operation.

FIG. 8 is graph 801 of logarithm of current (I) versus voltage (V) for the memory cell of FIG. 7. FIG. 8 helps illustrate "set" and "reset" operations that are relied upon to change the contents of the memory cell. Initially, the cell may be in a high resistance state (denoted by the label "HRS" in FIG. 8, e.g., representing a logic "zero"). The current and voltage characteristics of this state are represented by a first curve 803 in FIG. 8. This high resistance state may be sensed by read and write circuitry using signal lines (e.g., column and row lines) as was previously described. For example, read and write circuitry may apply a read voltage $V_{read}$ across the cell for the purpose of sensing the resulting "off" current $I_{off}$ that flows through the cell and its semiconductor device layers. When it is desired to store a logic "one," the cell can be placed into its low resistance state by using read and write circuitry to apply a "set" voltage $V_{set}$ across the signal lines. The "set" voltage is typically greater than the "read" voltage and causes the cell to transition to its low resistance state, as indicated by dashed line 805 and by the acronym "LRS;" the voltage and current characteristics of this state are denoted by a second curve 807. As mentioned above and as will be described further below, it is theorized that the change in the resistive state may be effectuated by reason of the filling of traps (i.e., a may be "trap-mediated") in a metal oxide material.

As with the high resistance state, the low resistance state "LRS" of the cell can also be sensed using the read and write circuitry. When a "read" voltage $V_{read}$ is applied to the cell, read and write circuitry will sense the magnitude of the current flow which, given the relatively lower resistance, will be significantly higher than magnitude of the "off" current. The magnitude of this "on" current $I_{on}$ indicates that the cell is in its low resistance state. When it is desired to store a logic "zero" in the cell, a "reset" voltage $V_{reset}$ is placed across the cell to change its resistance state back the high resistance state HRS, as indicated by dashed line 809. The "reset" voltage is typically also greater than the "read" voltage, and in at least one embodiment, may be made to be of opposite polarity with respect to the "set" voltage. Voltage pulses of appropriate amplitude and duration (see FIG. 13) can be used for purposes of the operations just described.

Figure 9:
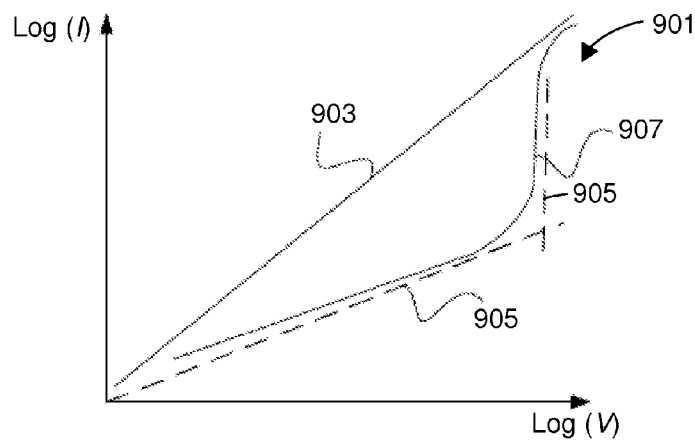
FIG. 9 presents a graph 901 that shows current versus voltage characteristics for multistable memory cells.

FIG. 9 presents a graph 901 of the logarithm of current (I) versus log of voltage (V) for a bistable memory cell. A straight line 903 represents the response of an Ohmic material when the ramped voltage is applied. An Ohmic response is undesirable, since there is no discrete voltage at which a state change (set or reset) occurs. Such a change is graphically represented by a set of two intersecting, dashed lines 905, with an abrupt change in current response occurring at a specific voltage. In practice, an appropriate response might follow a curve indicated by reference numeral 907, where the discontinuity (rapid increase in current) occurs at a "set" voltage, where the bistable cell switches from the high resistance state to the low resistance state.

The multistable resistance characteristic just described makes the memory cell suitable for storing digital data. Because data may be reliably stored in the absence of application of the described voltages, the cell may be considered nonvolatile. As mentioned previously, it is desirable for the cell to have a large difference between "off" current and "on" current (e.g., a relatively high $I_{on}/I_{off}$ ratio), which renders the states of the cell more easily detectable.

In the discussion below, additional information will be presented concerning the multistable materials just described and the mechanisms believed to be associated with state change.

1. Bulk-Mediated Switching.

As indicated above, a basic MIM structure includes two electrodes and a semiconductor device layer sandwiched in between the electrodes. The semiconductor device layer typically will include a metal oxide layer that includes an oxide of at least one metal and that that blends together the metal, metal oxide and oxygen with unknown, potentially complex bonding characteristics. The term "MIM" as used herein should be understood to potentially include other layers, and to encompass metal-insulator-insulator-metal, metal-insulator-insulator-insulator-metal and other, similar structures, including structures with other enhancement layers between them (e.g., to promote adherence of other layers).

Without being bound by theory, it is believed that the multistable structure described above uses a switching mechanism that is mediated in the bulk of the metal oxide layer. In one embodiment, the switching mechanism uses non-metallic conductive paths rather than filamentary or metallic conductive paths. Generally, defects are formed in the deposited metal oxide or can be enhanced by additional processes. Defects may take the form of variances in charge in the structure of the metal oxide. For example, some charge carriers may be absent from the structure (i.e., vacancies) or additional charge carriers may be present (i.e., interstitials). These defects may also be, depending on material, created or enhanced at the boundary of a metal oxide layer and another layer within the MIM structure. By applying a voltage to the multistable structure introduced above, the defects, such as traps, can either be filled or emptied to alter the resistivity of each cell. The bulk-mediated switching mechanism forms percolation paths through the bulk of the metal oxide which may be formed during a "set" operation and broken during a "reset" operation.

For example, in a multistable structure, during a "set" operation, the memory cell switches to a lower resistance state. The percolation paths that are formed by filling traps increase the conductivity of the metal oxide, thereby reducing (i.e., changing) the resistivity. At this voltage, traps are filled and there is a large jump in current as the resistivity of the metal oxide decreases.

As described below in conjunction with FIG. 13, the percolation paths can be described as non-metallic. With metallic materials, resistivity decreases with lower temperature. The multistable structures described herein demonstrate an increase in resistance with decreases in operating temperatures.

2. Defects.

The metal oxide includes electrically active defects (also known as traps) in the bulk of the semiconductor device layer. Traps can be "filled" by the application of the "set" voltage, and "emptied" by applying the "reset" voltage. Traps can be inherent in the metal oxide (i.e., existing from formation of the metal oxide) or created by doping, and enhanced by doping and other processes. For example, a hafnium oxide layer may include oxygen or hafnium vacancies or oxygen or hafnium interstitials that may form traps which can be used to create percolation paths and alter the conductivity of the hafnium oxide layer. The formation traps may also be enhanced by the deposition processes described herein, e.g., using a specifically-controlled closed-loop sputtering deposition process to create suitable mixtures of metal, metal oxide and oxygen.

Other processes may also be used to produce layers with these characteristics. In other words, the defects may be inherent in the metal oxide, depending on the process used to fabricate the semiconductor device layer in question. For example, atomic layer deposition ("ALD") processes and other physical vapor deposition ("PVD") may also be used deposit layers of the type described herein. The defects can be used to create localized charge variances that can be filled and emptied by applying voltage pulses to the metal oxides. Defects can also be enhanced by doping, for example, using the processes and structures explained in more detail below.

3. Scaling and Bandgap.

Figure 10:
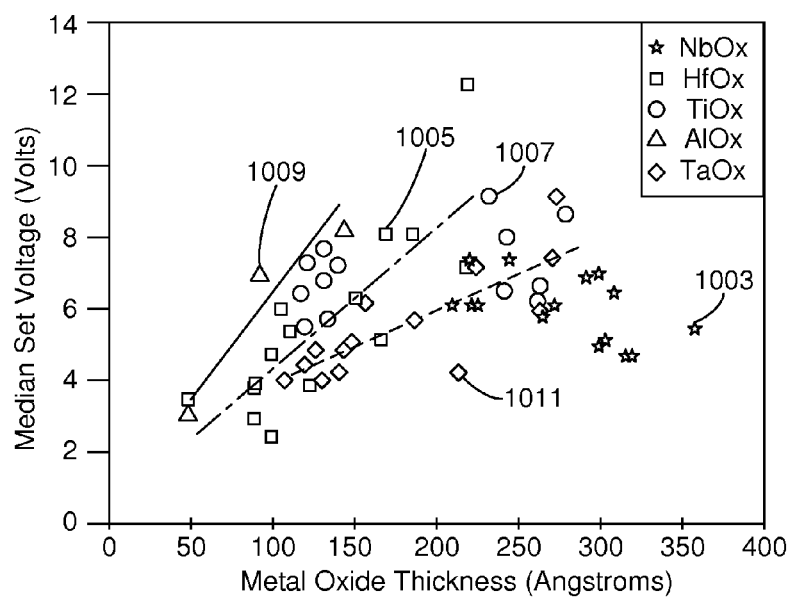
FIG. 10 presents a graph 1001 showing the relationship between thickness of a metal oxide layer and median "set" voltage for multistable memory device; different types of points are presented, represented by different shapes 1003, 1005, 1007, 1009 and 1011, each associated with a different type of metal oxide usable for the semiconductor device layer of a multistable memory cell.
Figure 11:
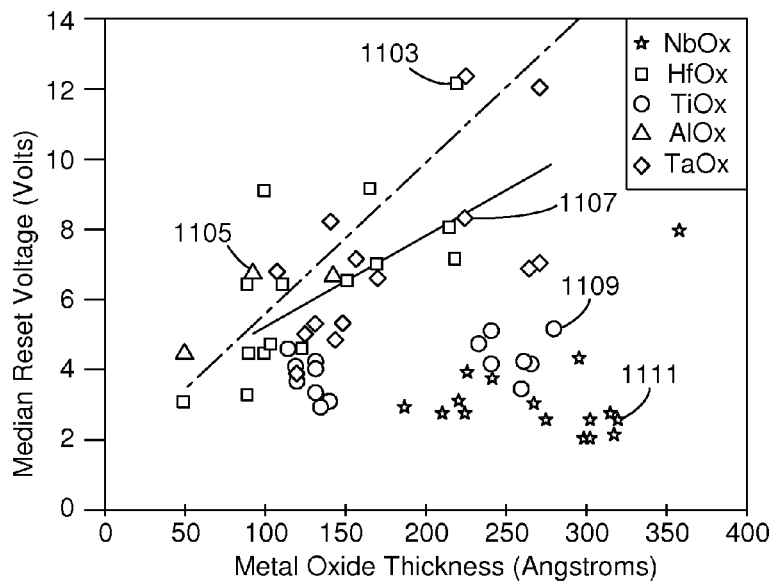
FIG. 11 presents a graph 1101 showing the relationship between thickness of a metal oxide layer and median "reset" voltage for multistable memory device; different types of points are presented, represented by different shapes 1103, 1105, 1107, 1109 and 1111, each associated with a different type of metal oxide usable for the semiconductor device layer of a multistable memory cell.

FIGS. 10 and 11 show the relationship between thicknesses of a metal oxide layer and resulting "set" voltages and "reset" voltages. These graphs represent data for a system that includes two electrodes and a single layer of metal oxide disposed in between. FIG. 10 provides a chart 1001 that identifies median set voltage (in Volts) as a function of metal oxide thickness in Angstroms, again for oxides of niobium (1003), hafnium (1005), titanium (1007), aluminum (1009) and tantalum (1011). As can be seen in FIG. 10, for hafnium oxide 1005, aluminum oxide 1009, and tantalum oxide 1011, "set" voltage increases with (i.e., appears to be dependent on) thickness. In some embodiments, depending on materials used, the "set" voltage is at least one volt (V) per one hundred angstroms (Å) of the thickness of a metal oxide layer in the memory cell. Also in some embodiments, increases in the thickness of the metal oxide layer of 100 Å increase the "set" voltage by at least 1 V. Similarly, as shown in FIG. 11, "reset" voltage for hafnium oxide 1103, aluminum oxide 1105, and tantalum oxide 1107 also depends on thickness. These data therefore support a bulk-controlled "set"/"reset" mechanism for these materials, since FIGS. 10 and 11 indicate a generally linear relationship between both "set" voltage and thickness and "reset" voltage and thickness—a linear relationship in turn indicates the formation of percolation paths throughout the bulk of the metal oxide. In other words, for a thicker material, more voltage is needed to fill the traps.

It should be noted in connection with FIGS. 10 and 11 that for niobium oxide and titanium oxide, the "set" and "reset" voltages appear to be independent of layer thickness (see, e.g., numerals 1109 and 1111 in FIG. 11). Each of these materials is a relatively low bandgap material, i.e., having a bandgap of less than 4 eV. Therefore, a higher bandgap (i.e., bandgap greater than 4 eV) metal oxide exhibits bulk mediated switching and scalable "set" and "reset" voltages. In other words, "set" voltage and "reset" voltage can be reduced by reducing the thickness of the high bandgap metal oxides such as hafnium oxide. Therefore, for smaller devices, "set" and "reset" voltages can be lowered.

Figure 12:
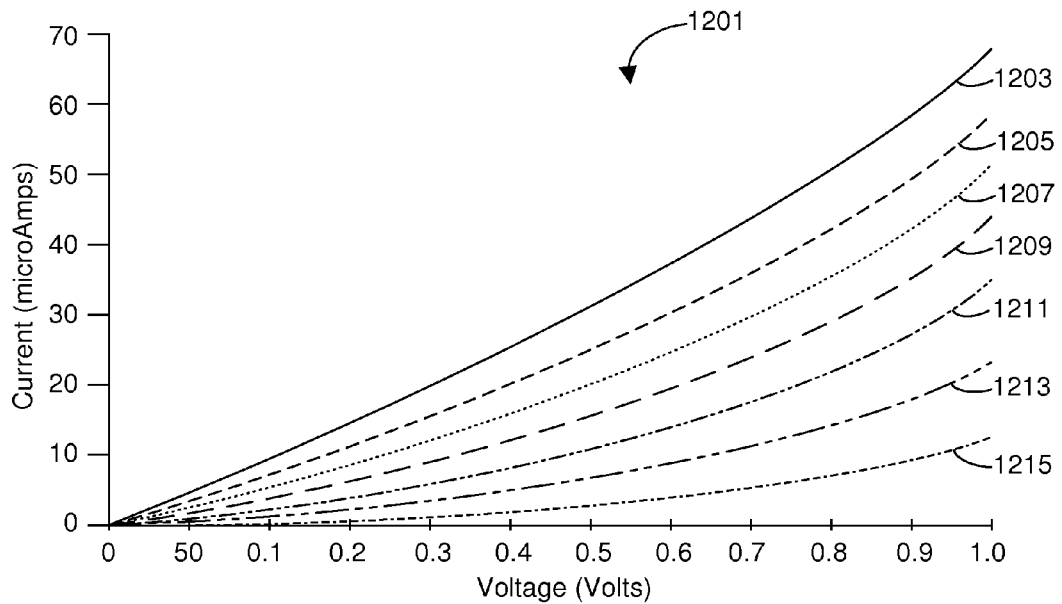
FIG. 12 is a graph 1201 that shows a number of curves 1203, 1205, 1207, 1209, 1211, 1213 and 1215; the curves are used to illustrate behavior of metal oxides as, effectively, non-metallic substances.

FIG. 12 provides a graph 1201 that illustrates a non-metallic nature of metal oxides used for the memory cells described herein. The graph 1201 shows increasing resistivity for a high-bandgap (i.e., greater than 4 eV) oxide layer with decreasing temperatures, which is a characteristic of a non-metallic material. The graph 1201 shows a sweep in voltage on the x-axis versus current on the y-axis. As seen in FIG. 12, the measurements 1203 taken at a three-hundred Kelvin (300 K) level show the greatest current output, and thus lowest resistivity. Measurements taken at 250 K, 150 K, 100 K, 60 K, 350 K, and 10 K, denoted by numerals 1205, 1207, 1209, 1211, 1213 and 1215, respectively, show increasing resistivity (i.e., lower current) as the temperature decreases. Some embodiments described herein therefore include metal oxides that exhibit non-metallic switching mechanisms.

Generally speaking, a semiconductor device layer may be constructed to include metal oxides of any phase (e.g., crystalline and amorphous); however, the data presented in FIGS. 3 and 4 and elsewhere herein indicate that amorphous materials which include both metal and metal oxide (created with complex bonding characteristics, as part of a specifically-controlled, closed-loop reactive sputtering process) may provide better results because of increased resistivity. In this case, defects, impurities (i.e., substitution defects), atomic vacancies, and interstitials (surplus atoms) may all contribute to enhanced formation of the switching mechanisms described above.

B. Design Considerations.

For the structures discussed above, a wide variety of materials are suitable for use in (a) the semiconductor device layer (e.g., metal oxide layer), (b) one of the electrodes in a MIM stack, or (c) as one or additional layers or structures used with a MIM stack. For example, design considerations may include using more than one metal oxide in a single layer (co-deposition) or multiple layers (stacked), using electrodes that have different work functions, using at least one noble metal electrode, using different metal oxides having different bandgaps, and using low leakage materials.

1. Materials.

a. Metal Oxides (One or More Layers).

Specific base metal oxides that use bulk-mediated switching mechanisms include hafnium oxide, vanadium oxide, scandium oxide, aluminum oxide, tantalum oxide, zirconium oxide, and yttrium oxide. These metal oxides have a bandgap that is greater than 4 eV, indicating that they are more insulating and therefore have a higher resistivity. As explained above, the use of high bandgap (i.e., greater than 4 eV) metal oxides also allow for scaling of set voltage as related to metal oxide thickness.

These various metals and metal oxides may also be further doped with each other. Other dopants may include oxygen, silicon, silicon oxide, nitrogen, fluorine, chromium, and chromium oxide, as well as rare earth metals such as lanthanum, cerium, praseodymium, neodymium, gadolinium, erbium, ytterbium, and lutetium and their oxides.

Dopants can be selected by considering probable oxidation states with the potential to create defects. For example, hafnium atoms can have a +4 ($Hf^{+4}$) oxidation state, and aluminum atoms can have a +3 ($Al^{+3}$) oxidation state. Aluminum oxide can be doped into hafnium oxide, creating charge imbalances by creating substitution defects where aluminum atoms replace hafnium atoms (i.e., $Al_{HF}^{1-}$), and vice versa (i.e., $Hf_{Al}^{1+}$). These defects allow for the formation of percolation paths in the bulk of the metal oxide.

Another criterion for selecting dopants can be the difference between the valence (e.g., for a p-type dopant) or conduction (e.g., for an n-type dopant) band of the dopant and the valence or conduction band of the metal oxide. In some embodiments, a difference between the valence bands that is greater than 50 meV can provide deep-level dopants that can form deeper and more accessible traps in the bulk.

As alluded to earlier, in connection with the introduction of a closed-loop sputtering process, doping is at least to some extent preferred using the same metal as the metal oxide into which the dopant is doped. For example, a hafnium oxide layer can be doped with hafnium ions. Doping can also be performed using implantation, for example. Implantation energy may generally be in the range of 0.5 keV to 10.0 keV depending on the ion being implanted and the thickness of the metal oxide. This doping can improve memory cell yield.

Doping may also be performed by interdiffusion, by depositing two adjacent layers of metal oxides (e.g., hafnium oxide and aluminum oxide or hafnium oxide and titanium oxide). These layers can then be thermally treated by, for example, rapid thermal anneal (RTA), rapid thermal oxidation (RTO) or a forming gas anneal. The thermal treatment causes interdiffusion of defect species between the materials, creating localized charge differences which can serve as trap states. Doping can be performed either isovalently or aliovalently, and by implantation or co-deposition.

If desired for the particular implementation, a metal oxide can be to have a metal nitride electrode and a metal oxide adjacent to the metal nitride electrode. The metal to form the metal oxide and the metal nitride are the same. For example, a memory cell can be formed having a titanium nitride electrode and a titanium oxide layer adjacent to the titanium nitride electrode. This structure may serve to stabilize the interface and promote adherence of other layers, for example. The memory cell can also include other metal oxides (e.g., aluminum oxide or hafnium oxide) in a stacked or co-deposited manner.

In still further embodiments, multiple oxides can be combined together in discrete layers to adjust the current flow characteristics of the memory cell. One layer consisting predominantly of a one metal oxide (or one combination of oxide, oxides or metals) can have a smaller "on" current than the second layer formed of a different combination or to have different current flow characteristics.

b. Electrodes.

Electrode materials may include silicon, silicides, titanium nitride (TiN), nickel, platinum, iridium, iridium oxide, ruthenium and ruthenium oxide. According to some embodiments, one electrode may be a higher work function material, and the other electrode may be a lower work function material. For example, in one embodiment, at least one electrode is a high work function material such as a noble or near noble metal (i.e., a metal with a low absolute value free energy change ($|\Delta G|$) of oxide formation). Noble or near noble metals include iridium, iridium oxide, platinum, ruthenium, and ruthenium oxide. The other electrode may be a lower work function material such as titanium nitride, or may also be a noble or near noble material. In some embodiments, the "reset" voltage at the electrode having the higher work function may be applied as a positive polarity pulse (i.e., the higher work function electrode is the anode of the memory cell). The electrodes can also be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. The multi-layer electrodes can be used to improve adhesion properties and performance of memory cells in some configurations and embodiments.

2. Oxide Stacks.

The insulator or semiconductor device layer of the MIM stack can also be constructed using multiple layers of oxides. The combination of oxides can be used to impart desired characteristics to memory cells. Three types of layers, including a base layer, a doping layer, and a defect access layer are described below. Each of the doping and defect access layers are optional, and may or may not be pertinent to a particular implementation. The stack may also optionally include another electrical device such as an embedded transistor or diode (referred to below as a "current steering element"). While the various layers for these memory cells can be deposited using any appropriate technique including dry (CVD, ALD, PVD, PLD, evaporation) and wet (liquid chemical e.g., ELD, ECD) techniques, they are preferably deposited using the specific controlled-loop processes described herein. Combinations of these techniques can also be used. For example, one layer can be deposited using PVD and another deposited using ALD.

The operation of memory cells that include multiple oxide layers is generally the same as that described above for a cell having a single metal oxide layer. For example, the set and reset pulses and percolation paths described above apply equally to both single layer metal oxide embodiments and multiple layer metal oxide embodiments. Generally speaking, oxide stacks can be used to impart desired characteristics to a memory cell. For example, a defect access layer can increase the effective work function of an adjacent electrode, thereby reducing the needed work function of the electrode. In some instances, stacking oxides can improve "set" and "reset" voltage distribution and also facilitate better memory cell yield.

a. Base Layer.

The base layer is the metal oxide layer in which defects are present and in which the bulk-mediated switching takes place. The base layer is, in some embodiments, a high bandgap material (e.g., greater than 4 eV) that preferably has leakage of less than 40 Amps/cm$^2$ in the off state measured at 0.5V per 20 Å of thickness of the metal oxide. In other embodiments, an increase in the thickness of the metal oxide of 100 Å can result in an increase of the set voltage of 1 V, as described above.

b. Doping Layer.

As mentioned above, the base layer may be specifically doped, either directly or using layer that diffuses into the base layer when the stack is annealed or otherwise thermally treated (e.g., rapid thermal anneal (RTA), rapid thermal oxidation (RTO), rapid thermal forming gas anneal (RTF)). For example, using an aluminum oxide base layer, a titanium oxide doping layer can be deposited between the cathode and the base layer to create additional defects including substitional defects in the base layer. The doping layer can be chosen to aliovalently dope into the base layer. For example, the base layer may include hafnium oxide and the doping layer may include aluminum oxide. A typical defect species of hafnium oxide is $Hf^{+4}$, and a typical defect species of aluminum oxide is $Al^{+3}$. $Al^{+3}$ ions displace $Hf^{+4}$ ions in the hafnium oxide layer, thereby creating defects and traps. In some embodiments, a doping layer (e.g., titanium oxide) may have the same most common oxidation state (e.g., +4) as the base layer. In these cases, aliovalent doping may still occur when other species having different oxidation states (e.g., $Ti^{+3}$) diffuse into the base layer.

c. Defect Access Layer.

A defect access layer is a layer between the anode and the base layer. The defect access layer is a thin layer (i.e., 25% as thick as the base layer or less) that allows the electrode to better access the defects in the base layer while in some embodiments reducing currents because of the increased resistivity of the defect access layer. In some embodiments, one electrode has a higher work function than the other electrode and, in these embodiments, the defect access layer is adjacent to the high work function electrode. The defect access layer can increase the effective work function of the adjacent electrode, thereby allowing the use of less noble or non-noble electrodes. Additionally, depending on the materials chosen, the electrode may show better adhesion to the defect access layer than the metal oxide of the base layer. Therefore, the defect access layer can be used in materials systems as an adherence layer to promote physical integrity of the memory cell. In another embodiment, the defect access layer can be a thin (e.g., less than 50 Å or less than 20 Å) stable oxide such as aluminum oxide, to facilitate use of non-noble electrodes as a higher work function electrode.

d. Structural Examples.

Figure 13:
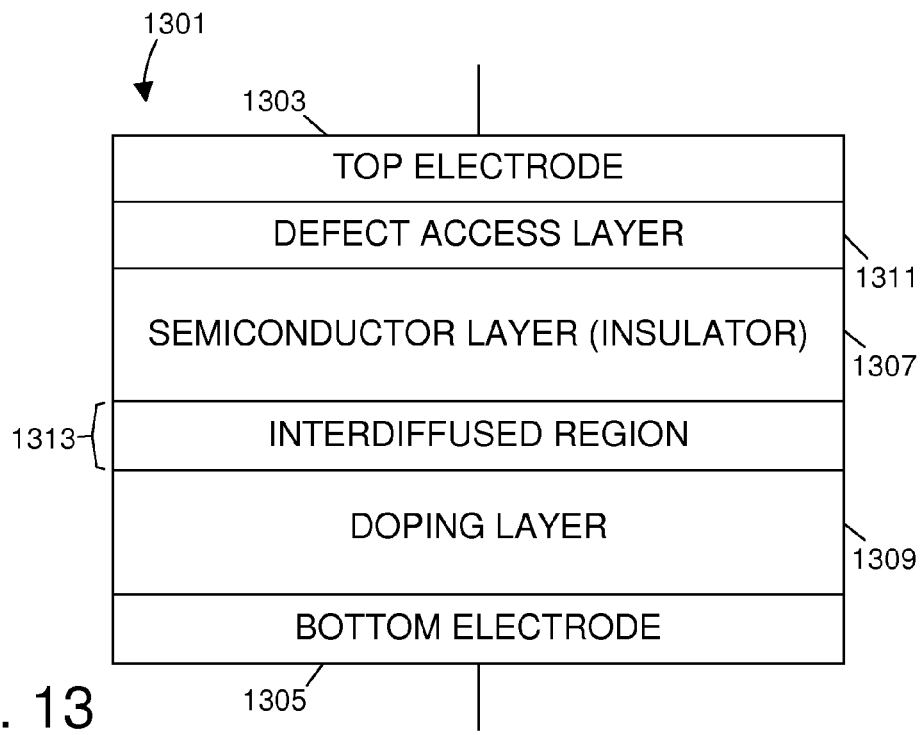
FIG. 13 shows an exemplary multistable memory cell; the particular cell illustrated in FIG. 13 includes a base layer and optional doping and defect access layers.

FIG. 13 illustrates a memory cell 1301 using a stacked oxide system according to various embodiments. The cell includes the two electrodes 1303 and 1305, as well as a base layer 1307 and a doping layer 1309. The base layer may be a transition metal oxide with a bandgap greater than 4 eV such as hafnium oxide, aluminum oxide, tantalum oxide or other materials, fabricated according to the processes described herein. The doping layer may be another material such as titanium oxide, scandium oxide, yttrium oxide, niobium oxide, or one of the other doping materials described herein. In some embodiments, the doping layer can be chosen so that the metal of the doping layer has a different most common oxidation state than the metal of the base layer (e.g., the base layer may be hafnium oxide with a $Hf^{4+}$ oxidation state and the doping layer can be aluminum oxide with an $Al^{3+}$ oxidation state). The illustrated three layer system can use doping to create defects in the base layer 1307, and to increase the effective work function of the electrode 1303. In some embodiments, the same material can be used for the defect access layer 1311 and the doping layer 1309.

The memory cell 1301 of FIG. 13 includes an interdiffused region 1313. The interdiffused region can be formed by annealing the memory cell, for example, at 300-1000° Celsius (C.) for ten seconds (s) to four hours or more. The annealing causes the migration of charged species within the crystalline structure, thereby forming or deepening defects and traps which can be used to form percolation paths.

To provide a first example of materials that may be used in a structure corresponding to FIG. 13, in one embodiment, titanium nitride, silicon, silicide, or a noble metal can be used for one electrode, hafnium oxide can be used as the primary constituent of the base layer, aluminum oxide can be used as a doping layer, and a noble or near-noble metal such as platinum, iridium, iridium oxide, ruthenium, or ruthenium oxide can be used for a second electrode. In such a system, additional defects may be created by interdiffusion or aliovalently doping aluminum substitutionally into the hafnium oxide layer. The different oxidation states of hafnium and aluminum create traps, which mediate the bulk-mediated switching mechanism.

In a second example, the base layer can be any transition metal oxide having a bandgap greater than 4 eV, a "set" voltage of greater than 1 V per 100 Å of thickness, and a leakage current density less than 40 Amps/cm² at 0.5 V per 20 Å of metal oxide in the "off" state. Examples include hafnium oxide, aluminum oxide, tantalum oxide, and zirconium oxide. The other layers can also be formed from transition metal oxides, such as titanium oxide or niobium oxide, or from materials that exhibit high resistivity or other desirable characteristics. Some other examples include stacks that blend (a) titanium oxide, hafnium oxide and titanium oxide layers, (b) hafnium oxide and yttrium oxide layers, or (c) yttrium oxide and hafnium oxide layers.

e. Use of a Current Steering Element.

Other electrical components may also be associated with each memory cell. These devices, which are sometimes referred to as current steering elements, may include, for example, diodes, p-i-n diodes, silicon diodes, silicon p-i-n diodes, transistors, etc. Current steering elements may be connected in series in any suitable location within or adjacent to the memory cell, including in between one of the electrodes and the remainder of a cell or oxide stack, referenced above. Current steering elements may be used to enhance operation or control of memory cells (or other semiconductor structures), depending on the application.

III. PVD Processes.

A. Achieving Appropriate Balances During Deposition.

As mentioned earlier, it is generally desired to manufacture devices having selected electrical characteristics. By carefully regulating the voltage using during a biased target sputtering process, to not only maintain the voltage within the "mixed-mode" region of a hysteresis curve, but also maintaining a voltage that produces the selected characteristics, one can deposit semiconductor device layers having improved durability and operation. Use of these processes facilitates the generation of memory devices having (a) desirable leakage current characteristics, (b) desirable "off" current characteristics, or (c) a desirable "on" current to "off" current ratio. These processes may also be advantageously applied to many types of memory cells, such as RRAM, DRAM, MRAM, flash, phase change or other forms of memories, where it is desired to deposit one or more semiconductor device layers having desired characteristics.

Figure 14:
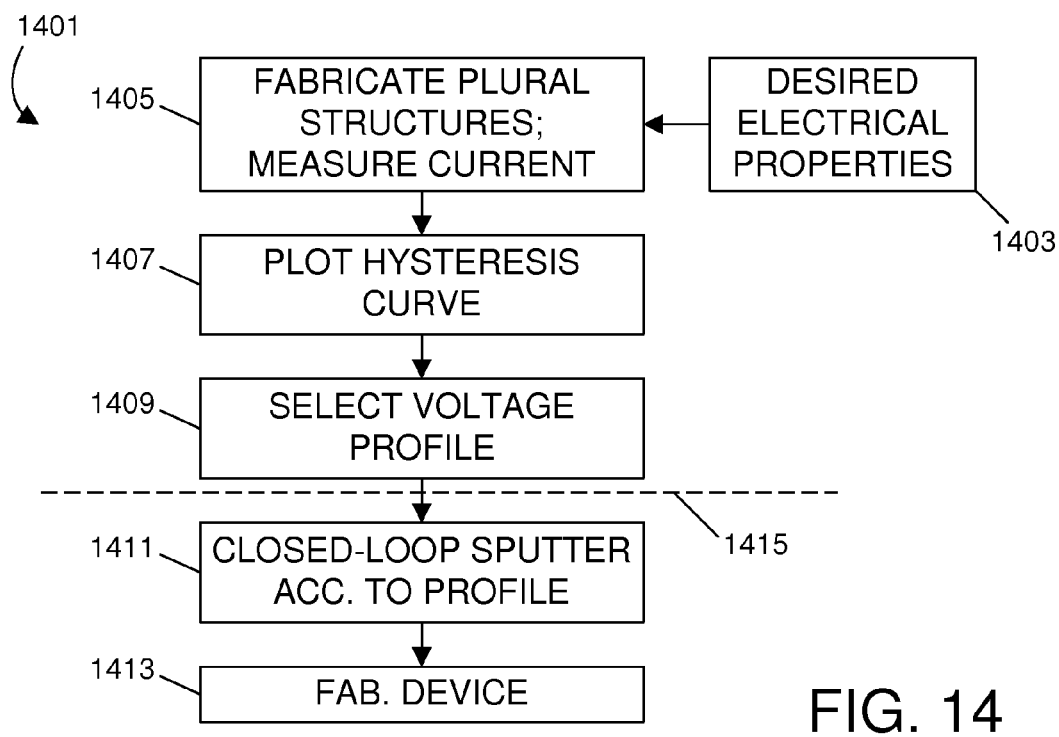
FIG. 14 includes a flowchart 1401 used to explain a pre-manufacturing process of selecting suitable control points for a specifically controlled closed-loop sputtering process, through the use of empirical data; a dashed line 1415 indicates that once the empirical data has been used to select voltage(s), the data may be applied in a run-time manufacturing process (represented below the dashed line 1415).

FIG. 14 provides a flow chart 1401 that illustrates steps that may be used to apply these teachings to the manufacture of devices. In particular, a starting point for this method may be a desired set of electrical properties, as represented by block 1403. To predetermine specific closed-loop sputtering voltages that will be used in manufacture, one first obtains data that identifies how the desired electrical property varies as a function of target (cathode) voltage. If desired, one may also determine variation in deposition rates associated with this voltage variance (as was indicated earlier in connection with FIGS. 3 and 4). For purposes of the determination, a closed-loop sputtering process of the type previously described, and of the type that will be used in manufacturing, is preferably used to obtain empirical data; the data may also be generated by a third party or by the specific manufacturer. These various tasks may be associated with function block 1405 in FIG. 14. Once empirical data is generated, a hysteresis curve is then plotted and used to identify the mixed-mode region and an appropriate voltage or voltages within that region to manufacture a semiconductor device layer (e.g., a metal oxide layer) having the desired properties, all as represented by reference numeral 1407. With this information, one or more voltages may be selected for use in the closed-loop deposition process. As indicated by block 1409, the voltage or voltages may be associated with a "voltage profile," but what is meant by this is that each voltage will be associated with a specific time or point with the deposition; if desired, a single voltage may be applied throughout fabrication of a single semiconductor device layer, or it may be desired to apply different voltages at different times. For example, the data present in connection with FIG. 3, above, suggests that desirable characteristics may be obtained for oxygen concentrations as oxygen concentration is increased toward poison mode, as opposed to being decreased away from poison mode—it may be desired, therefore, to first apply a somewhat suboptimal voltage and, then, increase that voltage to a desired steady state point in a time-dependent manner. All of these things are encompassed by the term "voltage profile."

With the deposition parameters thus identified, one may apply these parameters in a closed-loop sputtering process to deposit a semiconductor device layer and fabricate a device, as represented by numerals 1411 and 1413 in FIG. 14. If desired, these steps may be performed well after the generation of hysteresis curve data, as represented by a dashed line 1415, which conceptually separates a pre-manufacturing process (above the line) from a run-time manufacturing process (below the line).

Using the techniques identified above, it is believed one may fabricate an amorphous metal oxide layer having a suitable combination of metal and its associated metal oxide.

Figure 15:
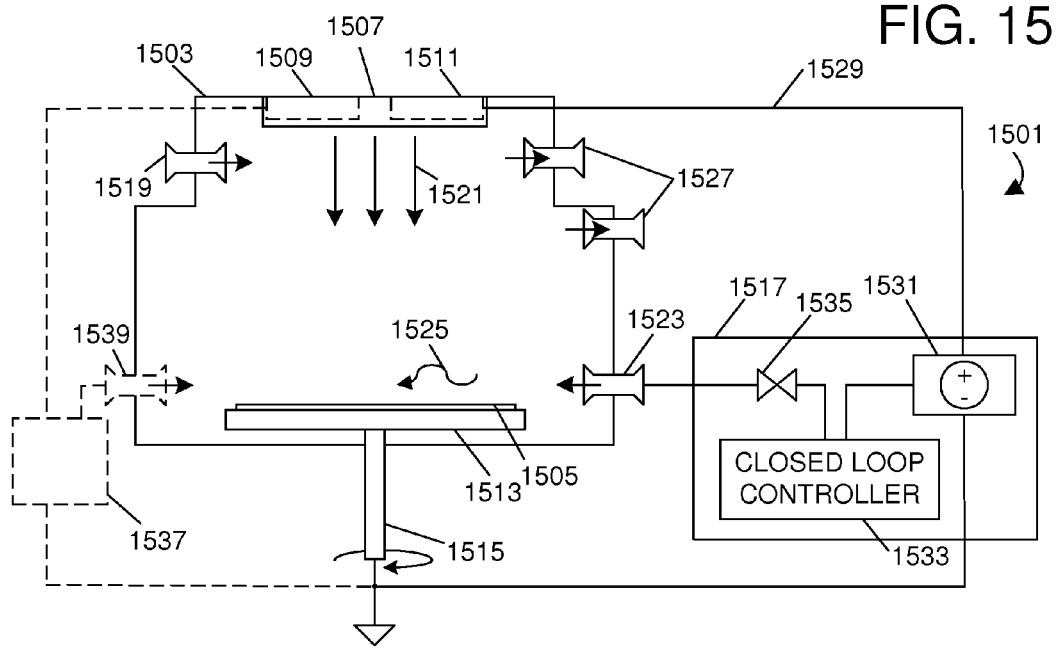
FIG. 15 illustrates a system schematic 1501, including a closed-loop sputtering chamber 1503; dashed lines in FIG. 15 represent optional elements that may be added to create a closed-loop co-sputtering process, in which multiple metals may be simultaneously sputtered, if desired, using different reactive gasses (injected via valves 1523 and optional valve 1539).

FIG. 15 provides an exemplary schematic diagram 1501 of a closed-loop sputtering process of the type described above. In particular, a sputtering chamber 1503 is seen to include a substrate 1505 and a target 1507. The substrate is positioned at the bottom of the chamber and faces upward toward the target, such that eroded material from the target may be deposited onto a top surface of the substrate. The substrate will typically consist of a semiconductor wafer or coupon (wafer portion) that may already have some layers deposited on it as part of a previous manufacturing task; for example, a bottom electrode and an optional doping layer may already exist on the substrate's top surface. FIG. 15 shows a deposition process where metal from a single target 1507 is to be deposited, but also uses dashed lines to illustrate a co-sputtering process, for example, using two targets 1509 and 1511, each consisting of a different metal. As indicated by numeral 1513, the substrate is mounted upon a pedestal, with both the substrate and pedestal being rotated via a drive shaft 1515, so as to ensure even layering during the sputtering process. The sputtering process described is a reactive process, and so material from the target ideally combines with a reactive element introduced into the chamber in appropriate combinations. Using the examples introduced above, this reactive element may be an oxygen source (e.g., $O_2$ or $O_3$ gas).

As mentioned, too much reactive gas may poison the target and lower cathode voltage—to avoid these potential problems, a closed-loop circuit 1517 is used to modulate supply of the reactive element, using cathode voltage feedback and modulation of reactive gas concentration to maintain cathode voltage.

The sputtering process results from the introduction of argon gas through a first valve 1519, which is ionized such that positive argon ions are generated and accelerated toward the cathode (i.e., the target, which serves as an electron source). The impact of the argon ions erodes the target to release metal into the chamber, as indicated by a set of directional arrows 1521. These ions then in part combine with the reactive gas, which is injected into the chamber by a second valve 1523. Oxygen, for example, will be dispersed in a partial vacuum to a point overlying the target (per arrow graphic 1525) where it may combine with metal ions and engender vapor deposition of a metal oxide mixture on the substrate's top surface. Spent gas, such as the argon gas and unused oxygen, may be evacuated from the chamber by yet another set of valves 1527; although these values are depicted at the top of the chamber, it should be appreciated that FIG. 15 is illustrative only, and that these "purge valves" will be positioned at an appropriate location within the deposition chamber, as with the other described elements.

As the reaction proceeds, the target (cathode) voltage may fluctuate, and because a conductive metal target is generally used, this voltage may be sensed and fed back to the closed-loop control circuit 1517 as indicated by numeral 1529. This control circuit includes an RF source 1531, a closed-loop controller 1533, and a high speed mass flow controller 1535 that controls the supply of the reactive element through the second valve 1523. Thus, flow of the reactive element (e.g., oxygen gas, $O_2$) is varied so as to urge the cathode voltage to maintain each predetermined voltage point to be used in the deposition process. The closed-loop controller may include a digital device, such as a workstation or laptop computer running appropriate software, or a dedicated digital device, to monitor cathode voltage and provide the appropriate control signals to the mass flow controller 1535.

B. Use of a Co-Sputtering Process and Generation of Appropriate Profiles.

As mentioned earlier, a co-sputtering process may also be used to sputter two metals at the same time to create a semiconductor device layer. If desired, these metals may be sputtered in the presence of a common reactive gas or, alternatively, a reactive gas localized to each of two targets. For example, as indicated by dashed lines in FIG. 15, if two metal targets 1509 and 1511 are used, each may be supplied with a dedicated closed-loop control circuit 1517 and 1537, respectively; each of these may include a dedicated mass flow controller to control release of the reactive gas via a dedicated control valve. Any number of targets can be used to deposit any number of metals as desired. It may also be desired to control a single source of reactive element so as to achieve a "best fit" given all of the materials being sputtered.

Perhaps the most direct way to manage precise voltage control in a co-sputtering process to achieve desired electrical properties is to empirically test a number of devices, each produced using pre-selected combinations of voltages for each target, in order to obtain preferred results.

Figure 16:
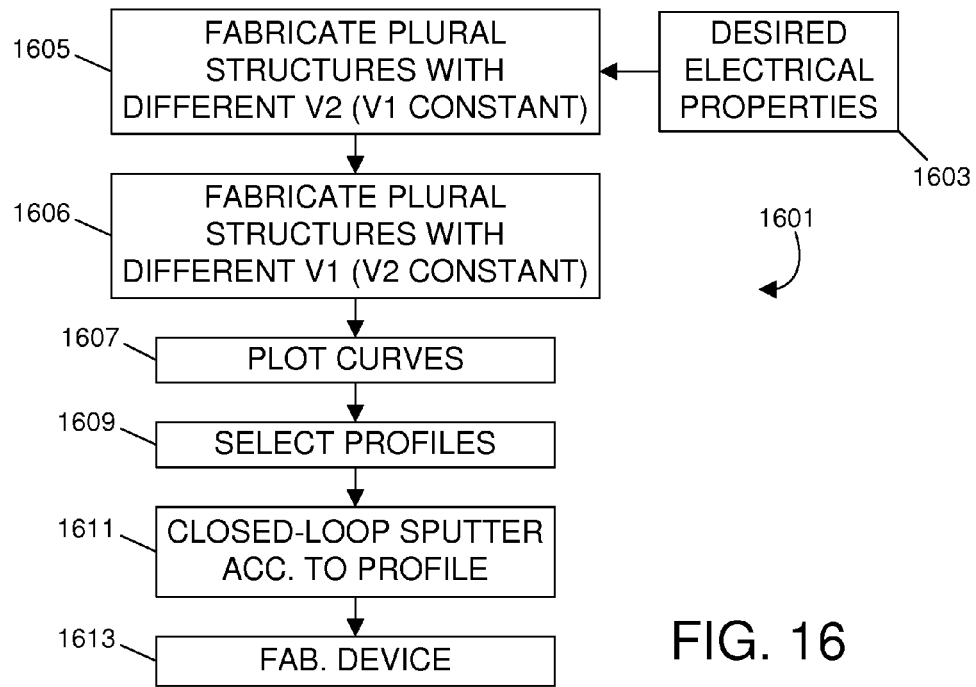
FIG. 16 is a flow chart diagram that shows one method of generating empirical data and hysteresis curves for a co-sputtering process; as with the example provided by FIG. 14, once associated voltage curves are obtained, the associated voltage data may be applied in a run-time manufacturing operation (represented by blocks 1611 and 1613 in FIG. 16).

FIG. 16 is used to demonstrate a process 1601 for identifying suitable deposition parameters for use in a closed-loop system where two targets are to be sputtered. It is believed that with a semiconductor device layer with combined materials (e.g., oxides of two different metals) that the electrical characteristics will be largely a function of the electrical characteristics of metal oxide taken in isolation, e.g., a superposition of each of those characteristics depending upon deposition methodology.

As indicated in connection with the method discussed above, one may first begin with a set of desired electrical properties, as indicated by functional block 1603. Identifying a cathode voltage for one target that is associated with mixed-mode deposition of the associated metal, one may then fabricate plural structures, each time varying the cathode voltage associated with the other metal. This process is indicated by function block 1605, where the first voltage is referenced as "V1" and the second voltage is referenced as "V2." The procedure is then switched, with the second voltage being held constant while different values of the first voltage (V1) are used to fabricate several more structures, and two hysteresis curves generated based on these results, as indicated by numeral 1607. With this empirical data, appropriate voltages for each target may then be chosen, as indicated by function block 1609 or, alternatively, additional tests can be conducted. The remainder of the process is as describe above in connection with FIG. 14, with sputtering being performed according to the selected voltages, and one or more devices being fabricated, as indicated by blocks 1611 and 1613, respectively.

As indicated above, and with reference to the data presented in FIGS. 3-4, 6 and 10-12, it is believed that with use of a closed-loop sputtering process with precise control of cathode voltage around pre-selected points (or a pre-selected profile), a semiconductor device layer having desired properties can be manufactured. Other layers including a top electrode and potentially a defect access layer or current steering element may then be added, and other processing steps performed (e.g., annealing to facilitate diffusion between layers) may then be performed to complete device manufacture.

IV. Conclusion.

What has been described is a method of fabricating a semiconductor device layer layer, namely, one which can be used as part of a MIM structure and as part of a memory cell. This methodology enables fabrication of devices having better electrical characteristics such as minimal leakage current, minimal "off" current, or appropriate ratios of "on" current to "off" current. Several example devices have also been presented, including a number of specific multistable memory devices; it should be understood that (a) these structures are exemplary only, (b) multistable and other memory cells described herein may also be constructed using other processes, and (c) the described processes may be applied to fabricate other types of devices that rely upon a semiconductor device layer or MIM structure, beyond those described herein. Other embodiments and applications will readily occur to those having skill in the art in view of the teachings provided above, or in view of the invention defined by the claims set forth below.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

The invention claimed is:

1. A memory cell comprising:
a bottom electrode;
a top electrode;
a metallic oxide layer operatively positioned between the top electrode and the bottom electrode,
wherein the metallic oxide layer has a multistable resistivity;
a doping layer; and
a defect access layer,
wherein a thickness of the defect access layer is less than 25% of the thickness of the metallic oxide, and
wherein the defect access layer comprises aluminum oxide.

2. The memory cell according to claim 1, wherein one of the bottom electrode and the top electrode comprises a metal selected from the group of titanium, ruthenium, iridium, nickel, and platinum.

3. The memory cell of claim 1, wherein the metallic oxide layer comprises a dopant, the dopant comprises one of oxygen, silicon, silicon oxide, nitrogen, fluorine, chromium, lanthanum, cerium, praseodymium, neodymium, gadolinium, erbium, ytterbium, lutetium, chromium oxide, lanthanum oxide, cerium oxide, praseodymium oxide, neodymium oxide, gadolinium oxide, erbium oxide, ytterbium oxide, or lutetium oxide.

4. The memory cell of claim 1, wherein the metallic oxide layer comprises aluminum oxide.

5. The memory cell of claim 1, wherein the metal oxide layer comprises hafnium oxide doped with hafnium ions.

6. The memory cell of claim 1, wherein the bottom electrode has a different work function than the top electrode.

7. The memory cell of claim 1, wherein one of the bottom electrode and the top electrode comprises one of silicon, silicides, titanium nitride, nickel, platinum, iridium, iridium oxide, ruthenium, or ruthenium oxide.

8. The memory cell of claim 1, wherein the bottom electrode comprises one of iridium, iridium oxide, platinum, ruthenium, or ruthenium oxide, and wherein the top electrode comprises titanium nitride.

9. The memory cell of claim 1, wherein one of the top electrode and the bottom electrode is a multilayered electrode.

10. The memory cell of claim 9, wherein the multilayered electrode comprises a first layer comprises one or more of ruthenium, ruthenium oxide, iridium, iridium oxide, or platinum and a second layer of tungsten, tungsten carbonitride, or tungsten carbon.

11. The memory cell of claim 1, wherein the doping layer comprises one of titanium oxide, scandium oxide, yttrium oxide, or niobium oxide.

12. The memory cell of claim 1, further comprising a current steering element.

13. The memory cell of claim 12, wherein the current steering element comprises one of a p-i-n diode, a silicon diode, a silicon p-i-n diode, or a transistor.

14. The memory cell of claim 1, wherein the metallic oxide layer is amorphous.

15. The memory cell of claim 1, wherein the defect access layer has a thickness of less than 20 Angstroms.

16. The memory cell of claim 1, wherein the defect access layer is disposed between the top electrode and the metallic oxide layer, and wherein the top electrode is a non-noble electrode.

17. The memory cell of claim 1, wherein the doping layer aliovalently dopes the metallic oxide layer.

18. The memory cell of claim 1, wherein the doping layer comprises aluminum oxide.

19. The memory cell of claim 18, wherein the metallic oxide layer comprises hafnium oxide.

* * * * *